United States Patent
Liu et al.

(10) Patent No.: US 10,269,926 B2
(45) Date of Patent: Apr. 23, 2019

(54) PURGING DEPOSITION TOOLS TO REDUCE OXYGEN AND MOISTURE IN WAFERS

(71) Applicant: Taiwan Semiconductor Manufacturing Company, Ltd., Hsin-Chu (TW)

(72) Inventors: Yi-Ying Liu, Hsin-Chu (TW); Chun-Wen Nieh, Zhubei (TW); Yu-Sheng Wang, Tainan (TW); Yu-Ting Lin, Tainan (TW); Wei-Yu Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 107 days.

(21) Appl. No.: 15/246,071

(22) Filed: Aug. 24, 2016

(65) Prior Publication Data

US 2018/0061959 A1  Mar. 1, 2018

(51) Int. Cl.
| | |
|---|---|
| H01L 21/02 | (2006.01) |
| H01L 21/285 | (2006.01) |
| H01L 21/321 | (2006.01) |
| H01L 29/66 | (2006.01) |
| C23C 16/44 | (2006.01) |
| H01L 21/324 | (2006.01) |
| H01L 21/67 | (2006.01) |
| H01L 21/687 | (2006.01) |
| H01L 21/768 | (2006.01) |
| H01L 29/45 | (2006.01) |
| H01L 29/49 | (2006.01) |
| H01L 29/78 | (2006.01) |

(52) U.S. Cl.
CPC ............ *H01L 29/665* (2013.01); *C23C 16/44* (2013.01); *H01L 21/02057* (2013.01); *H01L 21/28518* (2013.01); *H01L 21/324* (2013.01); *H01L 21/3212* (2013.01); *H01L 21/67167* (2013.01); *H01L 21/67207* (2013.01); *H01L 21/68771* (2013.01); *H01L 21/7684* (2013.01); *H01L 21/76897* (2013.01); *H01L 29/45* (2013.01); *H01L 29/4966* (2013.01); *H01L 29/7833* (2013.01)

(58) Field of Classification Search
CPC ... C23C 16/44; H01L 29/45; H01L 21/76897; H01L 21/7684; H01L 21/68771; H01L 29/665; H01L 29/7833; H01L 21/324; H01L 21/3212; H01L 21/28518; H01L 21/02057; H01L 21/67207; H01L 29/4966; H01L 21/67167
See application file for complete search history.

(56) References Cited

U.S. PATENT DOCUMENTS

| | | | |
|---|---|---|---|
| 6,265,312 B1 * | 7/2001 | Sidhwa | H01L 21/28556 257/E21.584 |
| 7,091,496 B2 * | 8/2006 | Takami | G01R 31/307 250/440.11 |

(Continued)

*Primary Examiner* — Savitri Mulpuri
(74) *Attorney, Agent, or Firm* — Slater Matsil, LLP (57) ABSTRACT

A method includes placing a wafer in a wafer holder, placing the wafer holder on a loadport of a deposition tool, connecting the wafer holder to a front-end interface unit of the deposition tool, purging the front-end interface unit with nitrogen, and depositing a metal layer on the wafer in the deposition tool.

20 Claims, 12 Drawing Sheets

(56) References Cited

U.S. PATENT DOCUMENTS

| | | | |
|---|---|---|---|
| 7,344,983 B2 * | 3/2008 | Deshpande | C23C 16/0227 |
| | | | 257/E21.162 |
| 7,559,992 B2 * | 7/2009 | Suzuki | H01L 21/67017 |
| | | | 118/715 |
| 7,667,271 B2 | 2/2010 | Yu et al. | |
| 7,910,453 B2 | 3/2011 | Xu et al. | |
| 8,008,184 B2 * | 8/2011 | Matsumoto | H01L 21/28556 |
| | | | 257/E21.584 |
| 8,377,779 B1 | 2/2013 | Wang | |
| 8,399,931 B2 | 3/2013 | Liaw et al. | |
| 8,603,348 B2 * | 12/2013 | Cheng | G11B 5/1278 |
| | | | 216/22 |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,837,293 B2 * | 12/2017 | Lai | H01L 21/67393 |
| 2008/0024773 A1 * | 1/2008 | Miyazaki | G01N 21/4738 |
| | | | 356/237.2 |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0370691 A1 * | 12/2014 | Yamada | C30B 25/14 |
| | | | 438/478 |
| 2015/0221515 A1 * | 8/2015 | Ho | H01L 21/26593 |
| | | | 438/530 |
| 2016/0118279 A1 * | 4/2016 | Iyer | H01L 21/67383 |
| | | | 427/8 |
| 2017/0040214 A1 * | 2/2017 | Lai | H01L 21/32136 |
| 2017/0288272 A1 * | 10/2017 | Kwak | H01M 10/0585 |

* cited by examiner

PURGING DEPOSITION TOOLS TO REDUCE OXYGEN AND MOISTURE IN WAFERS

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, when the sizes of the transistors are reduced, the resistance values of the components of the transistors will also increase, resulting in the degradation in the performance of the resulting transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor formation process and a corresponding metal deposition process are provided in accordance with various exemplary embodiments. The intermediate stages of depositing a titanium layer and a titanium nitride layer are illustrated in accordance with some embodiments. Some variations of some embodiments are discussed. Throughout the various views and illustrative embodiments, like reference numbers are used to designate like elements.

Figure 12:
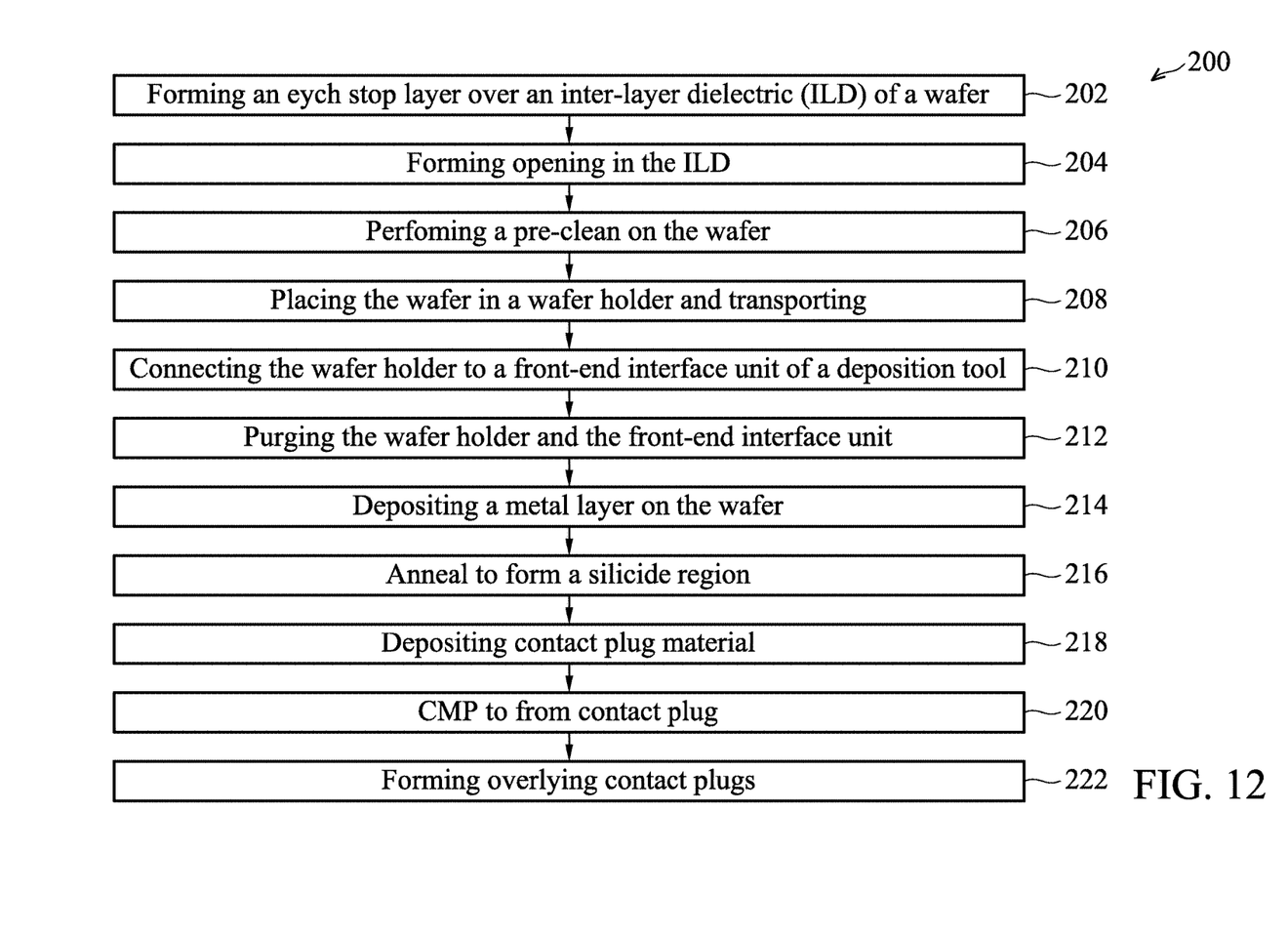
FIG. 12 illustrates a process flow for forming a transistor in accordance with some embodiments.

FIGS. 1 through 8 illustrate the cross-sectional views of intermediate stages in the formation of a transistor in accordance with some embodiments. The steps shown in FIGS. 1 through 8 are also illustrated schematically in the process flow shown in FIG. 12.

Figure 1:
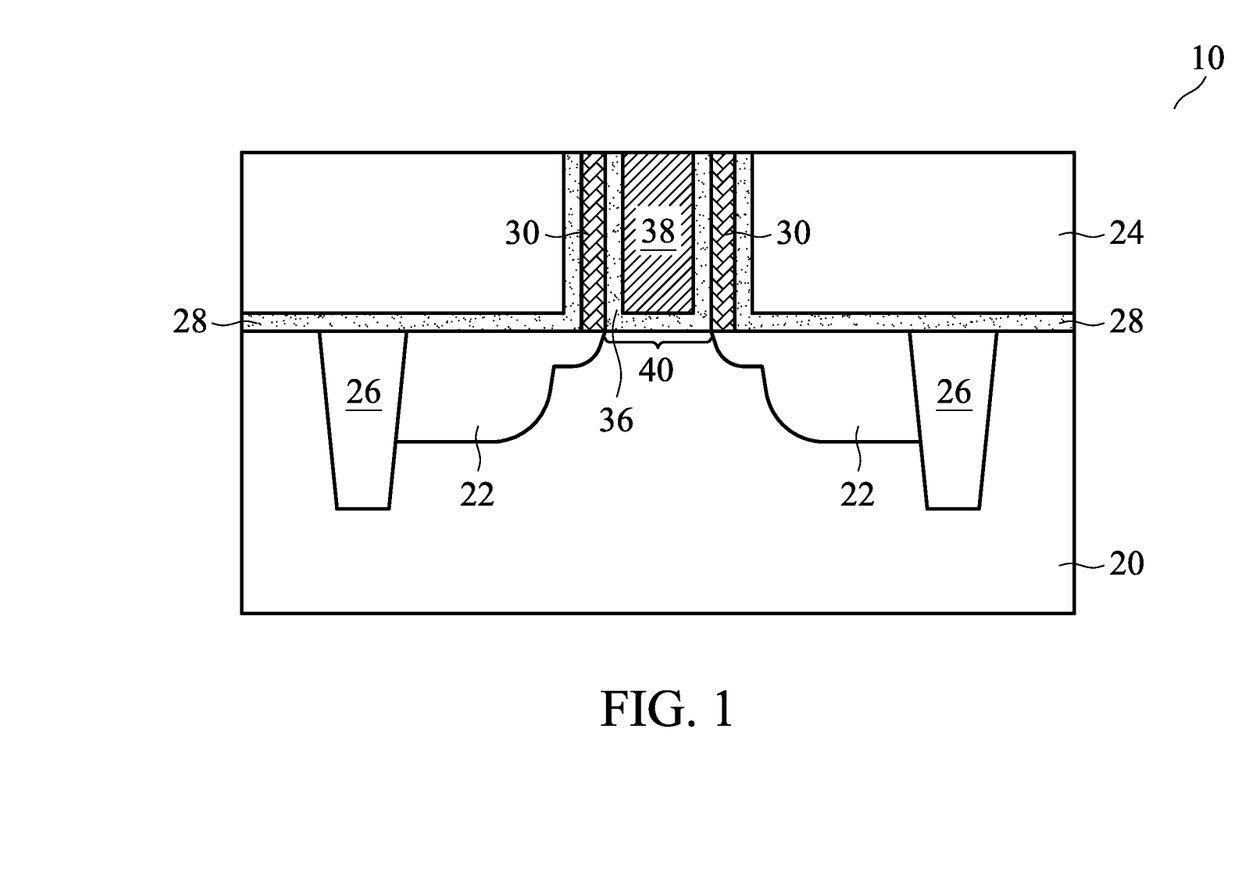
FIGS. 1 through 8 are cross-sectional views of intermediate stages in the formation of a transistor in accordance with some embodiments.

Referring to FIG. 1, wafer 10 is provided, on which an initial structure is formed. Wafer 10 includes substrate 20, which may be formed of a semiconductor material such as silicon, silicon germanium, silicon carbon, a III-V compound semiconductor material, or the like. Substrate 20 may be a bulk substrate or a Semiconductor-On-Insulator (SOI) substrate. Inter-Layer Dielectric (ILD, referred to as ILD0 hereinafter) 24 is formed over substrate 20. ILD0 24 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or another low-k non-porous dielectric material. The formation of ILD0 24 may be selected from, for example, Chemical Vapor Deposition (CVD), Flowable CVD (FCVD), spin-on coating, or the like. Shallow Trench Isolation (STI) regions 26 are formed to extend into semiconductor substrate 20, and are sued to isolate active regions in substrate 20 from each other.

Gate stack 40 is formed over semiconductor substrate 20, and gate spacers 30 are formed on the sidewalls of gate stack 40. In accordance with some embodiments of the present disclosure, gate stack 40 includes gate dielectric 36 and gate electrode 38 over gate dielectric 36. In accordance with some embodiments of the present disclosure, gate stack 40 is a replacement gate stack, which is formed by forming a dummy gate (not shown), removing the dummy gate after the formation of ILD0 24 in order to form a recess, and forming replacement gate stack 40 in the recess. Gate dielectric layer 36 may be a single layer or a composite layer that includes a plurality of layers. For example, gate dielectric layer 36 may include an interfacial oxide layer and a high-k dielectric layer over the oxide layer. The interfacial oxide layer may be a silicon oxide layer formed through thermal oxidation, chemical oxidation, or deposition. The high-k dielectric layer may have a k value greater than about 7, or as high as about 20 or higher. Exemplary high-k dielectric materials include hafnium oxide, zirconium oxide, lanthanum oxide, or the like.

Gate electrode 38 may also have a single-layer structure formed of a homogeneous conductive material, or have a composite structure including a plurality of conductive layers. In accordance with some embodiments of the present disclosure, gate electrode 38 includes a first layer formed of TiN, a second layer (work function layer) formed of TaSiN, WN, TiAl, TiAlN, TaC, and/or the like, and a third layer (filling layer) comprising aluminum. The formation of gate electrode 38 may include Physical Vapor Deposition (PVD), Metal-Organic Chemical Vapor Deposition (MOCVD), and/or other applicable methods, depending on the material of gate electrode 38.

In accordance with alternative embodiments, gate stack 40, instead of being a replacement gate, is formed by forming a planar gate dielectric layer, forming a planar gate electrode layer over the gate dielectric layer, and patterning the gate dielectric layer and the gate electrode layer, leaving gate stack 40. In accordance with some embodiments of the present disclosure, gate dielectric 36 is formed of silicon oxide, silicon nitride, a high-k dielectric material, or the like. Gate electrode 38 may be formed of polysilicon, for example.

Source and drain regions (referred to as source/drain regions) 22 are formed to extend into semiconductor substrate 20. In accordance with some embodiments of the present disclosure, source/drain regions 22 are formed through implanting a p-type or an n-type impurity into substrate 20. In accordance with alternative embodiments of the present disclosure, source/drain regions 22 are formed by etching substrate 20 to form recesses, and re-growing a semiconductor material in the recesses to form epitaxy source/drain regions 22. Source/drain regions 22 may be formed of silicon, silicon germanium, silicon phosphorous, silicon carbon, or the like. Contact Etch Stop Layer (CESL) 28 is formed to cover source/drain regions 22, and may extend on the sidewalls of gate spacers 30. In accordance with some embodiments of the present disclosure, CESL 28 is formed of silicon nitride, silicon carbide, or other semiconductor materials.

Figure 2:
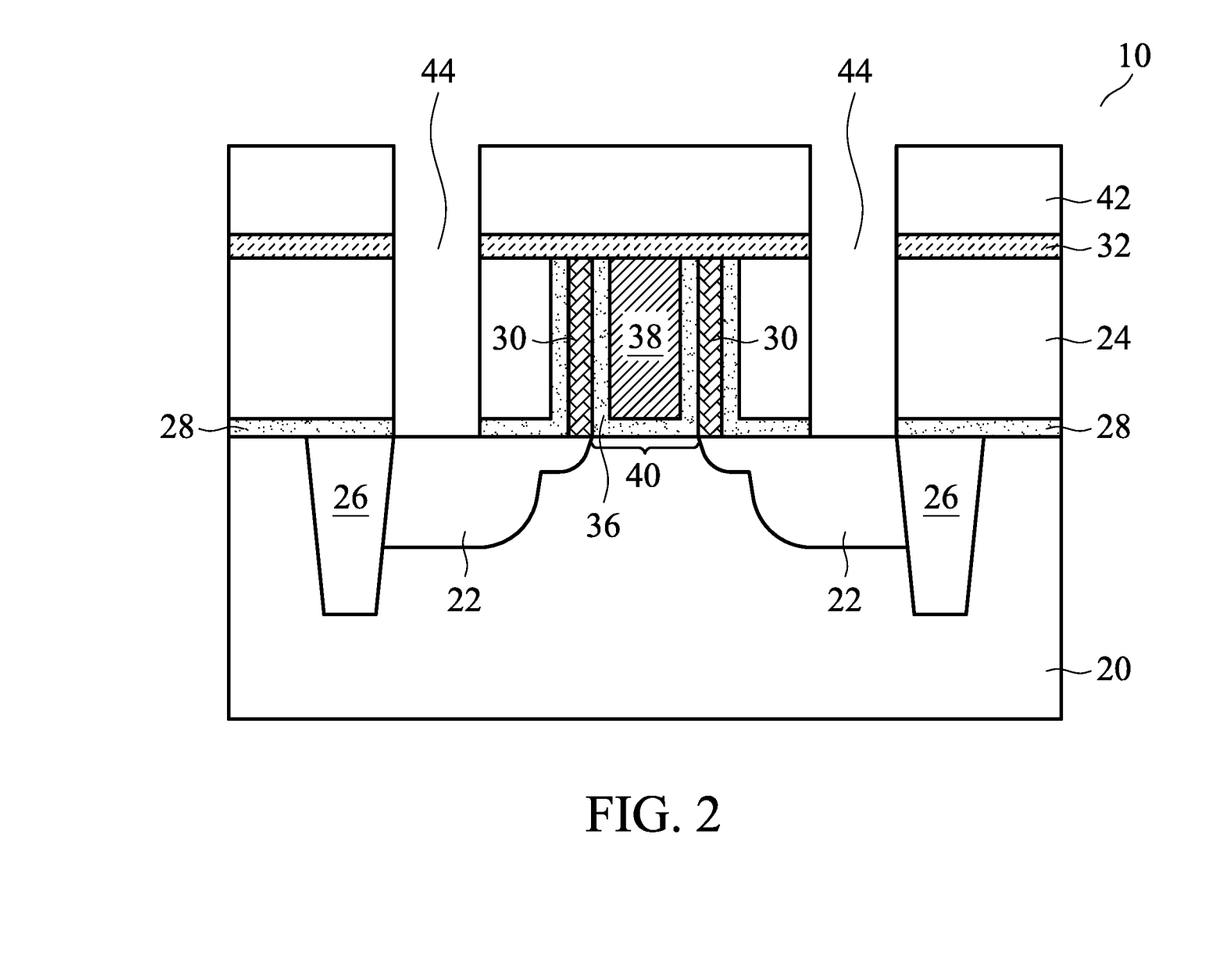

The top surface of gate stack 40 is coplanar with the top surface of ILD0 24, and the planarization may be achieved through a Chemical Mechanical Polish (CMP). Referring to FIG. 2, etch stop layer (ESL) 32 is formed over the top surfaces of ILD0 24 and gate stack 40. The respective step is illustrated as step 202 in the process flow 200 shown in FIG. 12. In accordance with some embodiments of the present disclosure, ESL 32 is formed of a dielectric material such as silicon carbon, silicon nitride, silicon oxynitride, or the like. Sacrificial ILD 42 may also be formed over ESL 32 in accordance with some embodiments. Sacrificial ILD 42 may include TEOS or other dielectric materials. In accordance with alternative embodiments of the present disclosure, ESL 32 and sacrificial ILD 42 are not formed. In accordance with yet alternative embodiments of the present disclosure, ESL 32 is formed, while sacrificial ILD 42 is not formed.

Next, openings 44 are formed by etching sacrificial ILD 42 (if any), ESL 32, ILD0 24, and CESL 28, so that source/drain regions 22 are exposed. The respective step is illustrated as step 204 in the process flow 200 shown in FIG. 12. After the formation of openings 44, a pre-cleaning step is performed to clean the exposed surfaces of source/drain regions 22, so that the native oxide formed on the surfaces of source/drain regions 22 is removed. The respective step is illustrated as step 206 in the process flow 200 shown in FIG. 12. After the pre-cleaning step, wafer 10 is rinsed in De-ionized (DI) water, and is then dried.

Figure 9:
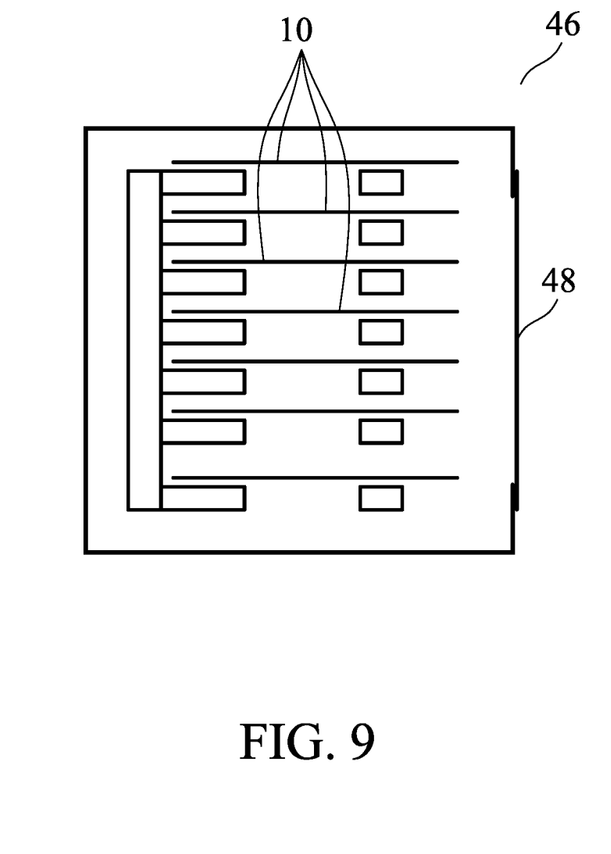
FIG. 9 illustrates a cross-sectional view of a wafer holder in accordance with some embodiments.

Wafer 10 is then placed in wafer holder 46, as shown in FIG. 9. The respective step is illustrated as step 208 in the process flow 200 shown in FIG. 12. Wafer holder 46 may be a Front Opening Unified Pod (FOUP) or a cassette, which is configured to store a plurality of wafers at the same time. A plurality of wafers 10 is thus placed in wafer holder 46, which is transported to a deposition tool for a subsequent metal deposition process. The respective step is also illustrated as step 208 in the process flow 200 shown in FIG. 12. After wafers 10 are placed in wafer holder 46, the door 48 of wafer holder 46 is closed. In accordance with some embodiments of the present disclosure, during the period of time wafer holder 46 is transported to the deposition tool, wafer holder 46 is filled with ambient air, which may be clean air at the pressure of one atmosphere. In accordance with alternative embodiments of the present disclosure, wafer holder 46 is purged with nitrogen ($N_2$), which is substantially free from oxygen and moisture (for example, less than 1 volume percent, less than 0.1 percent, 0.01 percent, 0.001 percent, or lower). During the transportation of wafer holder 46 to the deposition tool, wafer holder 46 may be filled with nitrogen also.

Figure 10:
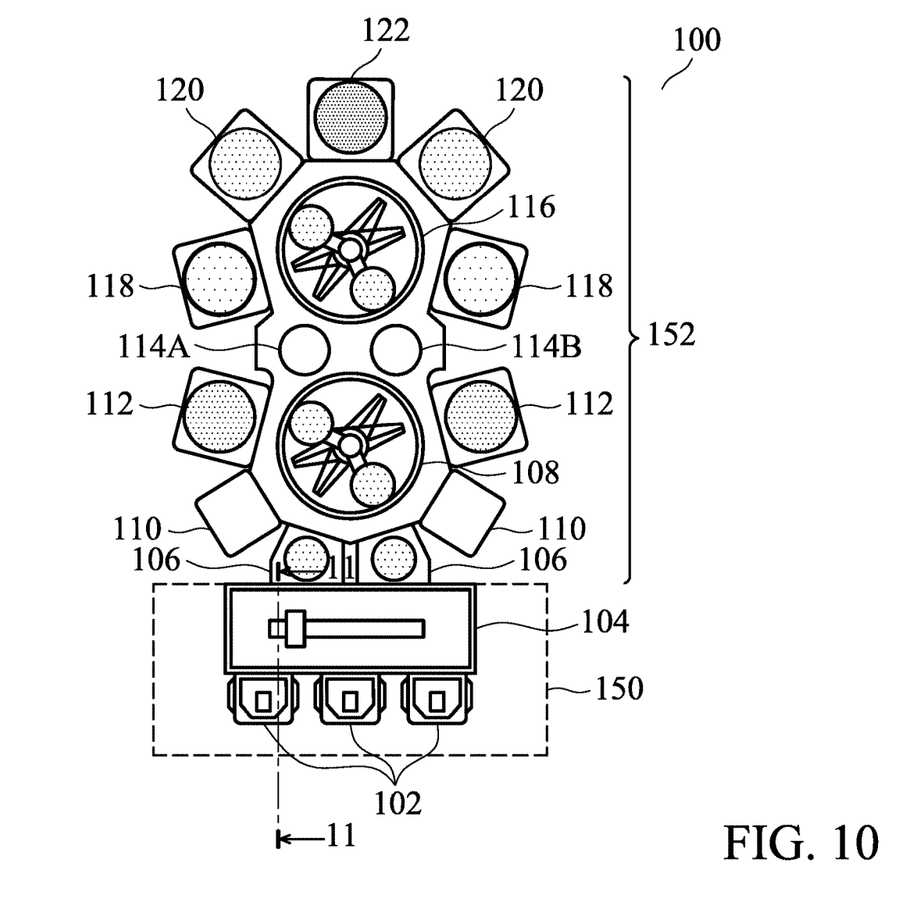
FIG. 10 illustrates a cross-sectional view of a deposition tool in accordance with some embodiments.

FIG. 10 illustrates deposition tool 100 in accordance with some embodiments of the present disclosure. It is appreciated that the deposition tool 100 shown in FIG. 10 is an example, and deposition tools having different designs are also in the scope of the embodiments of the present disclosure. Deposition tool 100 includes one or a plurality of loadports 102, which are used for docking/supporting wafer holder 46 (FIG. 9), so that the wafers in wafer holder 46 can be transferred into deposition tool 100 for processing. Loadports 102 are attached to front-end interface unit 104, which provides a miniature environment for a clean space in which exposed wafers and/or wafer cassettes may be transferred to and from the vacuum body 152 of processing tool 100. Front-end interface unit 104 is purged by nitrogen in order to minimize the exposure of wafers to moisture ($H_2O$) and oxygen ($O_2$).

In accordance with some embodiments of the present disclosure, an entirety of deposition tool 100 is located in ambient 150, which is purged with nitrogen. In accordance with alternative embodiments, vacuum body 152, which includes a plurality of vacuum chambers, is located in open air (or dry and clean air, which is air dehumidified to remove moisture and cleaned to remove particles), while loadports 102 are in ambient 150 purged with nitrogen. In accordance with yet alternative embodiments, the entire deposition tool 100, which includes vacuum body 152, front-end interface unit 104, and loadports 102 are located in an ambient, which is filled with dry and clean air.

Vacuum body 152 includes pass-through chambers 106, which are for wafers to pass through. Pass-through chambers 106 have doors to separate them from front-end interface unit 104, so that pass-through chambers 106 may be vacuumed. Buffer chamber 108 is used to transport wafers between chambers. In accordance with some embodiments of the present disclosure, Buffer chamber 108 is connected to pre-clean chambers such as degas chamber 110, clean chamber 112, SiCoNi™ chamber 118, and pass-through chambers 114A and 114B. Transfer chamber 116, which is configured to transfer wafers between chambers, is connected to pass-through chambers 114A and 114B, chambers 120 for depositing titanium nitride, and chamber 122 for depositing titanium.

Figure 11:
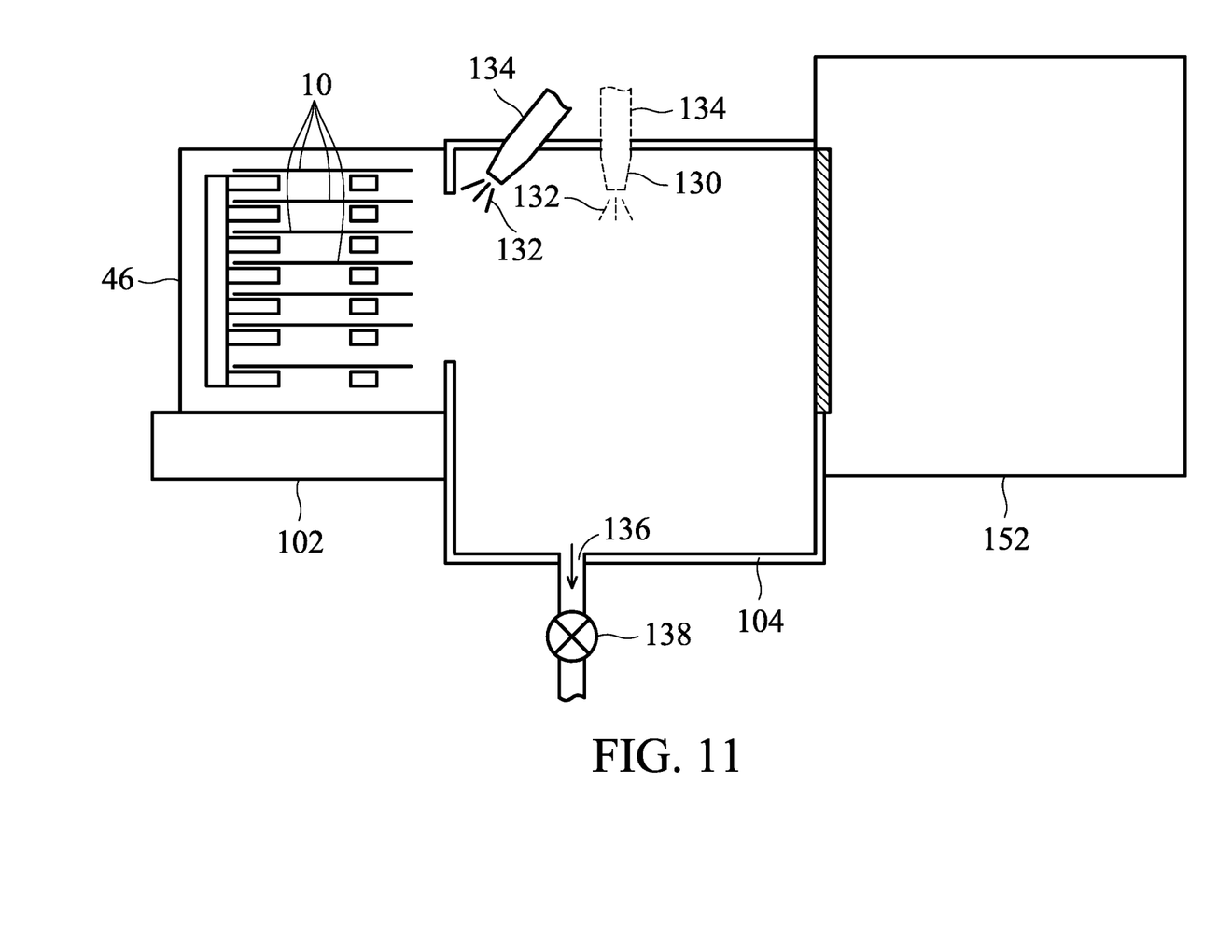
FIG. 11 illustrates a cross-sectional view of a wafer holder on the loadport of a deposition tool in accordance with some embodiments.

Wafer holder 46, which is transferred from the station for the pre-clean, is placed on one of loadports 102, which supports wafer holder 46. Wafer holder 46 is attached to, and connected to, front-end interface unit 104 as shown in FIG. 10. The respective step is illustrated as step 210 in the process flow 200 shown in FIG. 12. FIG. 11 illustrates a schematic cross-sectional view of deposition tool 100, wherein the cross-sectional view is obtained from the plane containing line 11-11 in FIG. 10. The door 48 (FIG. 9) of wafer holder 46 is opened, so that the inner space in wafer holder 46 and the inner space in front-end interface unit 104 are joined into a continuous space.

Front-end interface unit 104 has inlet 130 and outlet 136, which are used for conduct in and evacuate gaseous nitrogen ($N_2$), respectively. In accordance with some embodiments of the present disclosure, nitrogen dispenser 134, which is drawn schematically, is used to dispense nitrogen into front-end interface unit 104 in order to purge front-end interface unit 104. The respective step is illustrated as step 212 in the process flow 200 shown in FIG. 12. Throughout the description, the nitrogen used for purging front-end interface unit 104, ambient 150 (FIG. 10), and wafer holder 46 includes pure or substantially pure nitrogen (for example, with volume percentage greater than 99 percent or higher). Furthermore, the nitrogen is free from moisture and oxygen (for example, with the volume percentage of each of moisture and oxygen being less than 1 percent or 0.1 percent).

The nitrogen disposed into front-end interface unit 104 is evacuated from outlet 36, which may be located at the bottom of front-end interface unit 104, or located at any other location of front-end interface unit 104. Pump 138 is connected to outlet 136 to remove the gas including nitrogen in front-end interface unit 104. In accordance with some embodiments of the present disclosure, the purging of front-end interface unit 104 using nitrogen is a continuous process, which may be started before wafer holder 46 is placed on loadport 102, during the processing of wafers 10 in wafer holder 46, and after wafer holder 46 is transported away. Due to the continuous dispensing of nitrogen into front-end interface unit 104, and the pumping of nitrogen out of front-end interface unit 104, the pressure of nitrogen in front-end interface unit 104 is close to, or may be higher than or lower than one atmosphere, depending on the dispensing and pumping rates.

Nitrogen (represented by 132) may be blown toward, and directly into, wafer holder 46, as illustrated by dispenser 134 drawn with solid lines. This may improve the efficiency in driving out the gas and moisture inside wafer holder 46, and replacing the gas originally located in wafer holder 46 with the dispensed nitrogen. In accordance with alternative embodiments, nitrogen 132 is blown into front-end interface unit 104, and not directly toward wafer holder 46.

Due to the purging of nitrogen, the moisture and oxygen concentrations in front-end interface unit 104 and wafer holder 46 are significantly reduced. For example, ambient air may have moisture concentration higher than about ten thousand parts per million (ppm). Through the purging using nitrogen, the moisture may be reduced to lower than about 1,500 ppm. In addition, the humidity in front-end interface unit 104 and wafer holder 46 is reduced to lower than 30 percent. Depending on the purging time, the humidity may be further reduced to lower than about 10 percent or lower than about 5 percent, and the longer the purging time is, the lower the humidity will be.

Next, a first wafer 10 is retrieved from wafer holder 46, and is passed through front-end interface unit 104 and pass-through chamber 106 (FIG. 10). Wafer 10 goes through buffer chamber 108, and is passed into a first pre-clean chamber, which may be degas chamber 110. In degas chamber 110, wafer 10 is heated, for example, to a temperature between about 200° C. and about 400° C., so that the gas (such as oxygen and moisture) adversely absorbed in wafer 10 may be outgassed from wafer 10.

Figure 4:
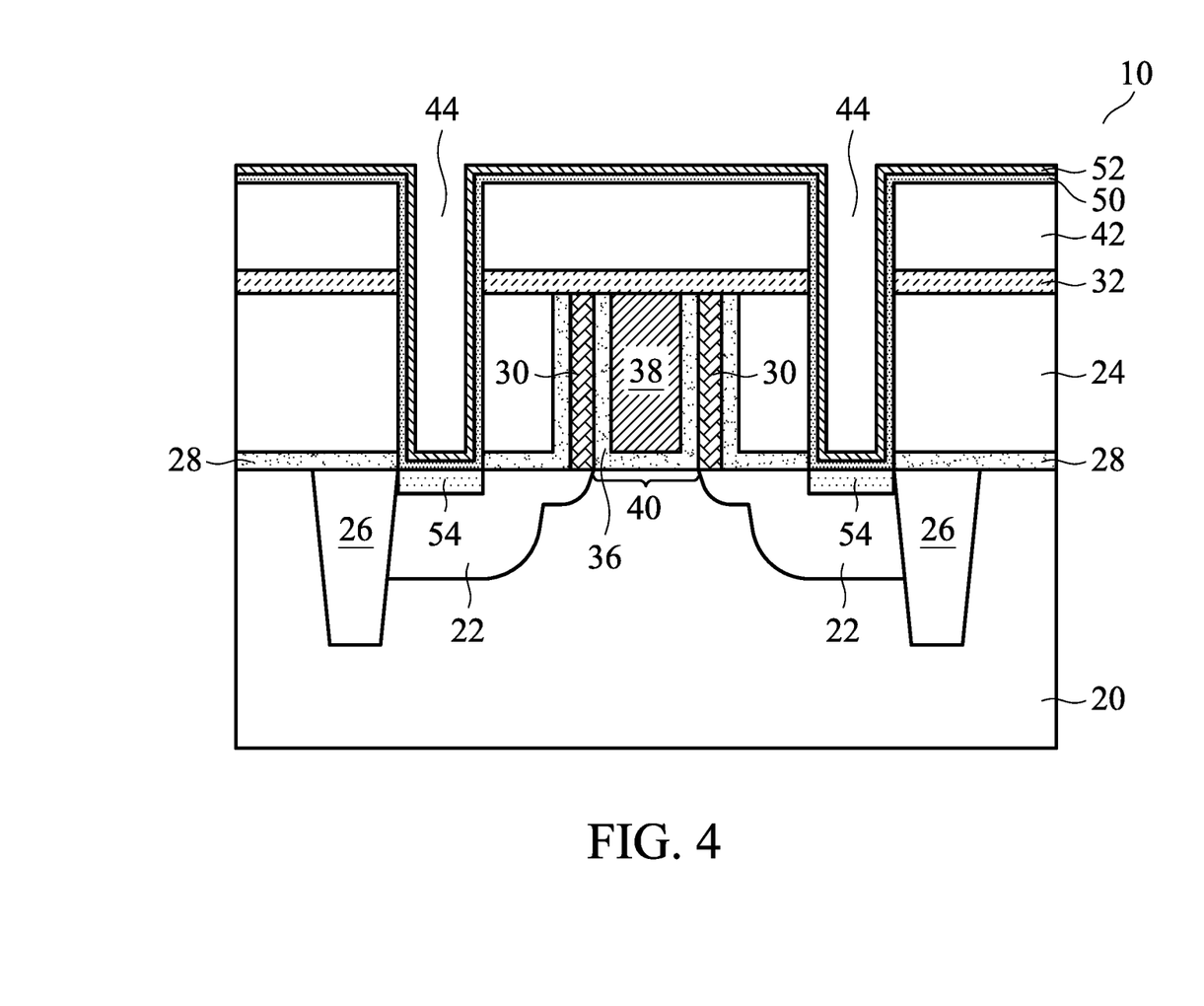

In accordance with some embodiments of the present disclosure, wafer 10 is sent into a second pre-clean chamber 112, which may be a PCXT chamber using argon bombardment to remove undesirable oxide at the bottoms of openings 44 (FIG. 4).

Figure 3:
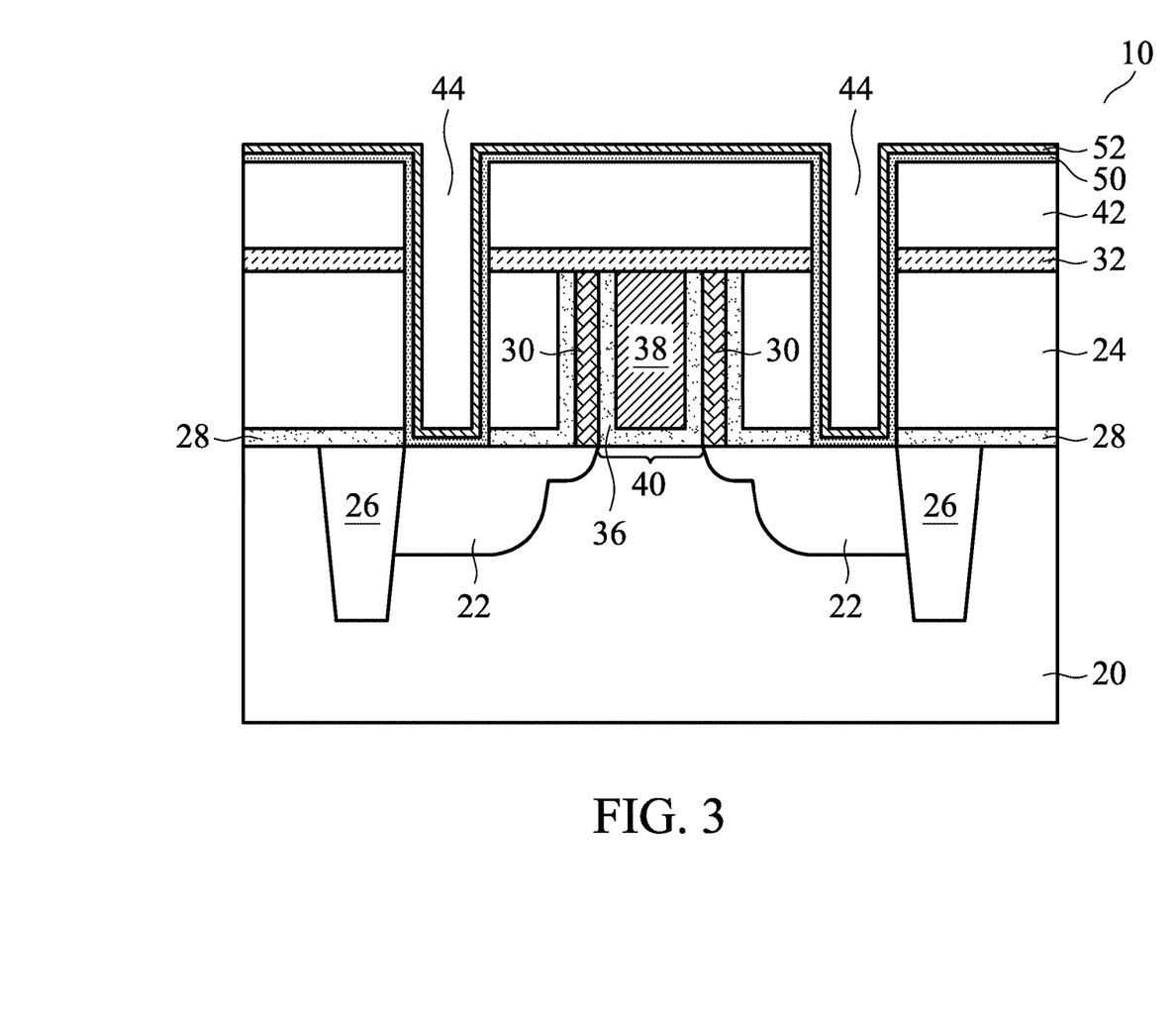

Next, wafer 10 is passed through pass-through chamber 114A, transfer chamber 116, and is then passed into a third pre-clean chamber 118. In accordance with some exemplary embodiments, pre-clean chamber 118 is an etching chamber for etching oxide (such as native oxide on sourced/drain regions 22 as shown in FIG. 3). The etching may be performed using SiCoNi™, which includes combined gases of $HF_3$ and $NH_3$.

In a subsequent step, wafer 10 is passed into chamber 122 to deposit a metal layer on wafer 10. The respective step is illustrated as step 214 in the process flow 200 shown in FIG. 12. In accordance with some embodiments of the present disclosure, the metal layer is titanium layer 50 as shown in FIG. 3. The deposition may be performed using PVD, for example. Wafer 10 is then passed into chamber 120 (FIG. 9) to deposit titanium nitride layer 52 (also refer to FIG. 3) on titanium layer 50. After the deposition, wafer 10 is transferred back into transfer chamber 116, and is then passed through pass-through chamber 114B, buffer chamber 108, pass-through chamber 106, and passed into front-end interface unit 104. From front-end interface unit 104, wafer 10 is put back into wafer holder 46 as shown in FIG. 11.

Wafer holder 46 may hold a plurality of wafers 10, which are processed (with metal layer(s) deposited) one by one. The metal deposition process of one wafer may take tens of minutes. Accordingly, from the time the first wafer 10 starts to be processed to the time the processing of the last wafer 10 is finished, it may take tens of minutes to several hours. During which time, wafers 10 in wafer holder 46 are exposed to the gases in front-end interface unit 104 and wafer holder 46. If front-end interface unit 104 is filled with ambient air (even if cleaned), the absorption of moisture and oxygen may be un-negligible. In addition, the deposited layer(s) 50 and 52 (FIG. 3) are also prone to absorbing oxygen and moisture if these layers are exposed to oxygen and moisture. The absorbed oxygen and moisture in wafers 10 may react with the subsequently formed metal silicide regions, causing the increase in contact resistance and the loss in yield. Experiment results performed in physical wafers revealed that the source/drain contact resistance is a function of the time wafer 10 is exposed to ambient air (which is the air in conventional front-end interface units), and the source/drain contact resistance increases significantly with the increase of the time wafers are exposed to ambient air. In accordance with the embodiments of the present disclosure, by purging front-end interface unit 104, wafer 10 is isolated from oxygen and moisture. Accordingly, the increase in the source/drain contact resistance is avoided, and the corresponding yield loss is prevented.

Referring back to FIG. 3, the deposited layers 50 and 52 extend into openings 44, with the bottom portions of titanium layer 50 in openings 44 in contact with the exposed portions of source/drain regions 22. In accordance with some embodiments of the present disclosure, rather than depositing titanium-containing layer(s), other metals such as nickel and cobalt, which may be used to form silicide regions, may be deposited in the preceding steps. The deposited titanium nitride layer may also be replaced with other metal nitride layers such as tantalum nitride layers.

Next, as shown in FIG. 4, a self-aligned silicidation is performed to form silicide regions 54 at the bottoms of openings 44. The respective step is illustrated as step 216 in the process flow 200 shown in FIG. 12. In the self-aligned silicidation, an anneal is performed to cause the reaction of metal layer 50 and source/drain regions 22, so that source/drain silicide regions 54 are formed at the top surfaces of remaining source/drain regions 22. The silicidation may fully consume the bottom portions of titanium layer 50, and the resulting silicide regions 54 may have top surfaces contacting the bottom surfaces of titanium nitride layer 52, which are left after the silicidation.

Figure 5:
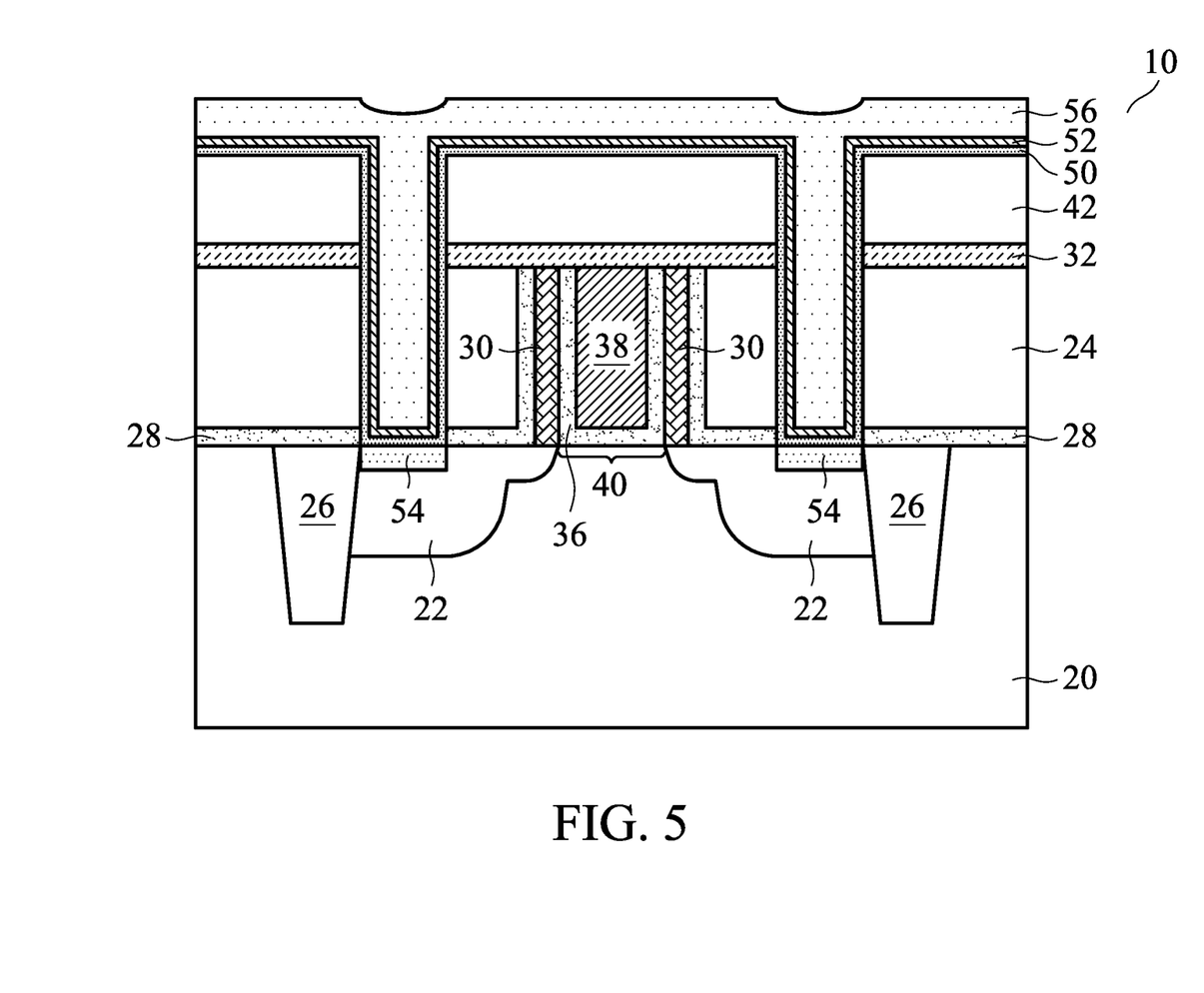
Figure 6:
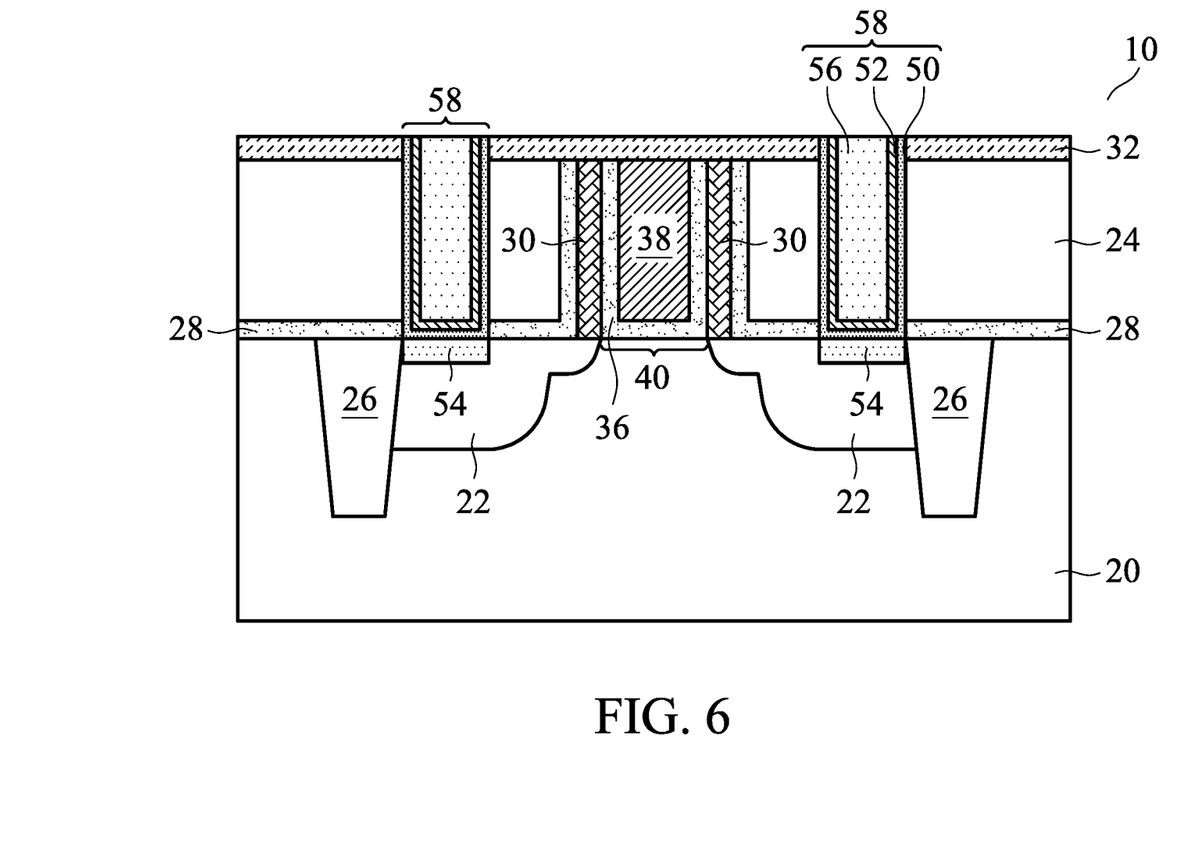

Referring to FIG. 5, conductive material 56, which may include a metal, a metal alloy, a composite metallic layer including a plurality of layers, or the like, is filled into the remaining openings 44 (FIG. 4). The respective step is illustrated as step 218 in the process flow 200 shown in FIG. 12. In accordance with some embodiments of the present disclosure, conductive material 56 is formed of tungsten. A CMP step is then performed to remove excess conductive material 56 and sacrificial layer 42. The respective step is illustrated as step 220 in the process flow 200 shown in FIG. 12. The resulting structure is shown in FIG. 6. During the CMP, ESL 32 is used as the CMP stop layer. The remaining portions of the conductive material(s) form contact plugs 58, which are referred to as M0_OD1s 58 hereinafter.

Figure 7:
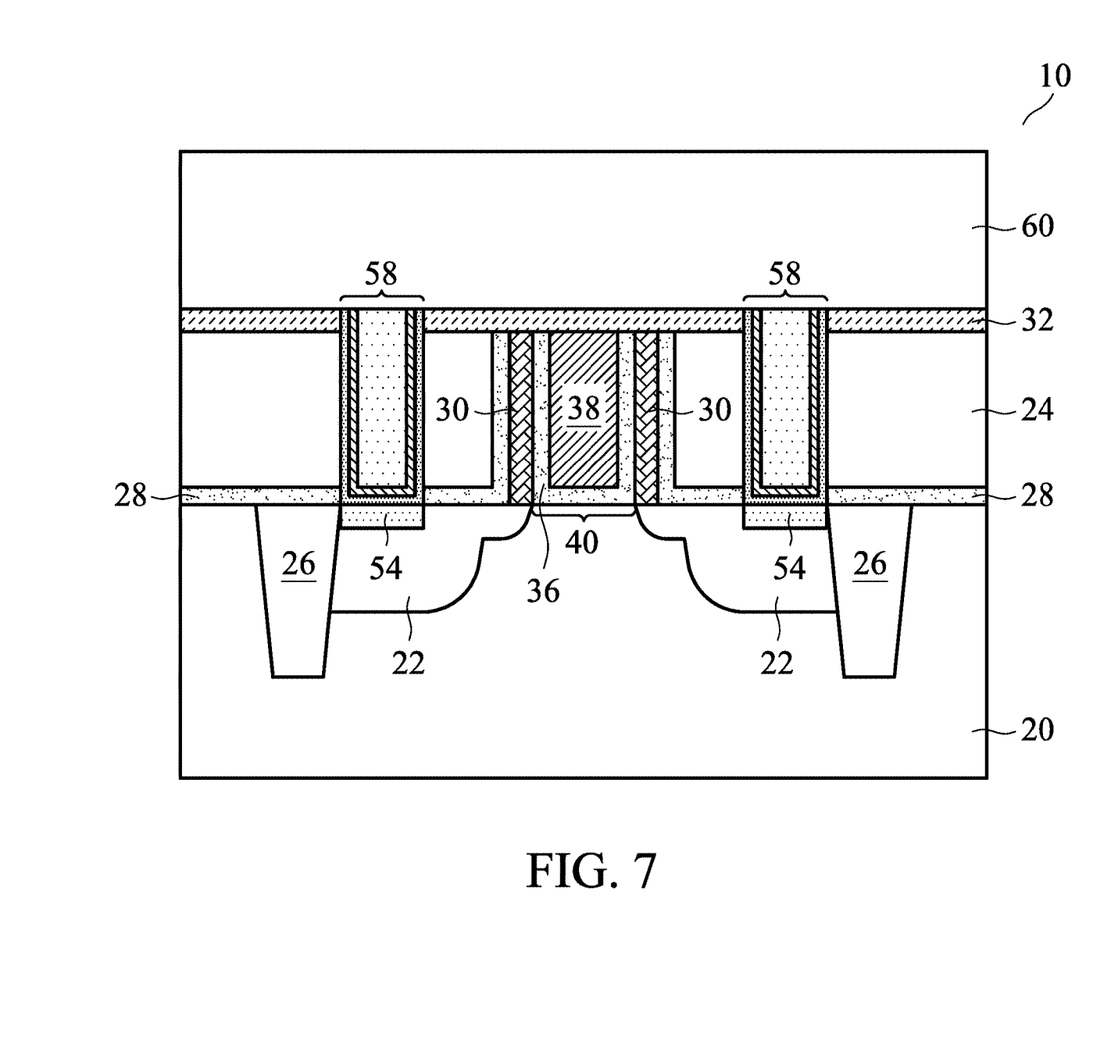
Figure 8:
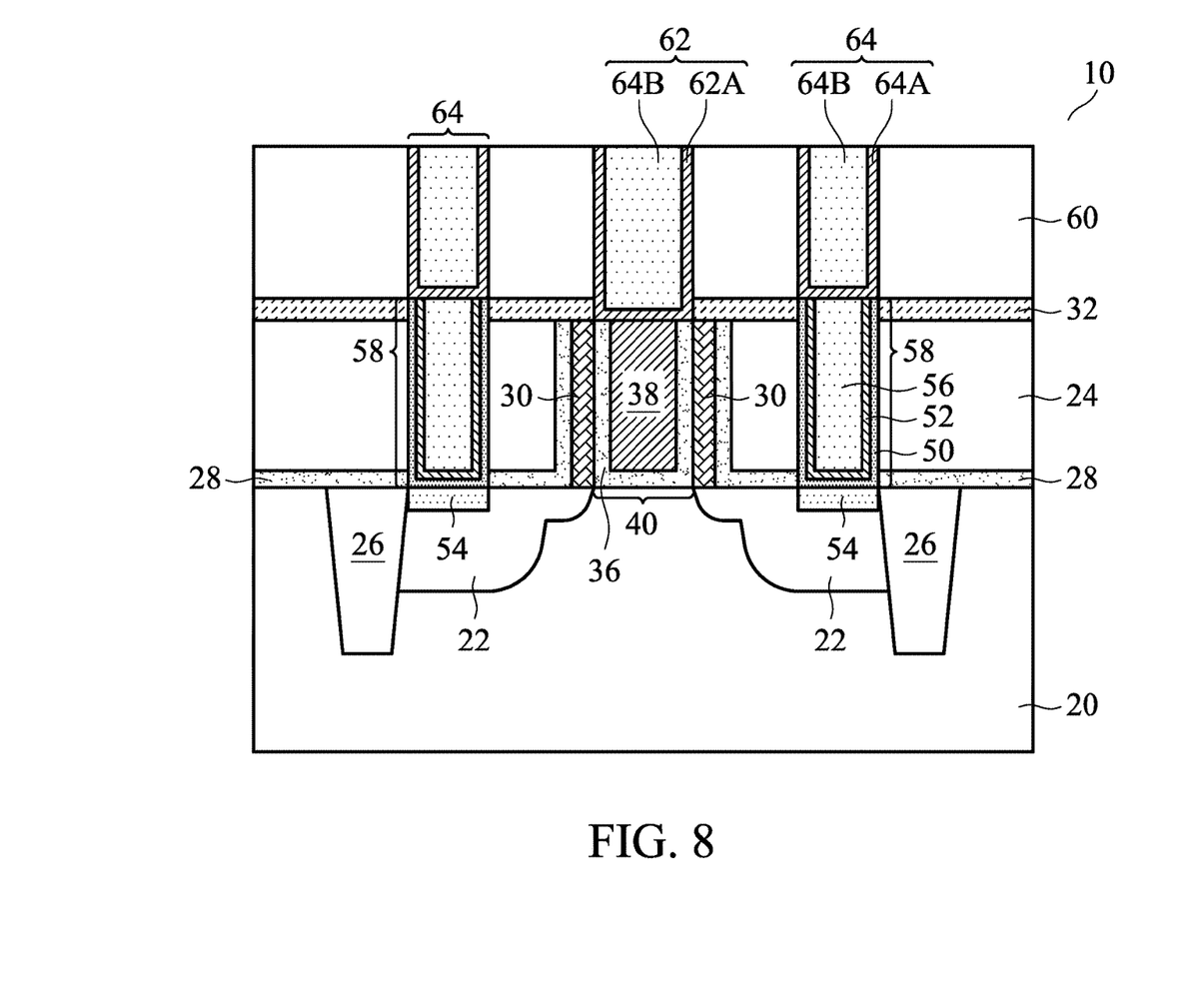

Referring to FIG. 7, another ILD, referred to as ILD1 60, is formed over ESL 32. ILD1 60 may be formed of PSG, BSG, BPSG, TEOS oxide, or the like. Next, as shown in FIG. 8, gate contact plug 62 and source/drain contact plugs 64 are formed. The respective step is illustrated as step 222 in the process flow 200 shown in FIG. 12. Gate contact plug 62 and source/drain contact plugs 64 may be formed simultaneously, or formed in different process steps. Source/drain contact plugs 64 are also referred to as M0_OD2 or upper source/drain contact plugs hereinafter. Source/drain contact plugs 64 are aligned to, and are in contact with, the respective underlying M0_OD1s 58, which are lower source/drain contact plugs. Gate contact plug 62 is electrically coupled to gate electrode 38. Each of gate contact plug 62 and source/drain M0_OD2s 64 may include a barrier layer, which is referred to as 62A or 64A, and a copper-containing region, which is referred to as 62B or 64B. The formation process may include etching ILD1 60 to formed openings, and filling the openings with a barrier layer and a copper-containing layer. In accordance with some embodiments of the present disclosure, barrier layers 62A and 64A include a layer selected from the group consisting of a titanium layer, a titanium nitride layer, a tantalum layer, a tantalum nitride layer, and multi-layers thereof. A CMP is then performed to remove the excess portions of the barrier layer and the copper-containing layer. The remaining portions of the barrier layer form barrier layers 62A and 64A, and the remaining portions of the copper-containing layer form copper-containing regions 62B and 64B.

The embodiments of the present disclosure have some advantageous features. In conventional metal-deposition processes, during and after the transportation of wafers using wafer holders, wafers may be exposed to oxygen and moisture. Furthermore, during the processing (such as metal layer deposition) of wafers using process tools, the wafers may be exposed to ambient environment for an extended period of time. Oxygen and moisture are absorbed by wafers. The absorbed oxygen and moisture are released during and after the formation of silicide regions, resulting in the oxidation of the silicide regions and the increase in the contact resistance. In the embodiments of the present disclosure, by purging front-end interface units and wafer holders, the exposure of wafers to oxygen and moisture is significantly reduced, and the adverse increase in contact resistance, and possibly yield loss, is reduced.

In accordance with some embodiments of the present disclosure, a method includes placing a wafer in a wafer holder, placing the wafer holder on a loadport of a deposition tool, connecting the wafer holder to a front-end interface unit of the deposition tool, purging the front-end interface unit with nitrogen, and depositing a metal layer on the wafer in the deposition tool.

In accordance with some embodiments of the present disclosure, a method includes forming a source/drain region on a wafer, performing a cleaning on the wafer using a diluted HF solution, placing the cleaned wafer into a wafer holder, transporting the wafer holder onto a loadport of a deposition tool, connecting a first inner space of the wafer holder to a second inner space of a front-end interface unit of the deposition tool, continuously purging the front-end interface unit with nitrogen, and depositing a metal layer on the wafer in the deposition tool.

In accordance with some embodiments of the present disclosure, a method includes purging a front-end interface unit of a deposition tool with a process gas. The process gas includes nitrogen, and is substantially free from oxygen and moisture, The method further includes, after the purging is started, placing a wafer holder on a loadport of the deposition tool, connecting a first inner space in the wafer holder to a second inner space in a front-end interface unit of the deposition tool, passing a wafer in the wafer holder into a vacuum body of the deposition tool through the front-end interface unit, depositing a metal layer on the wafer, and placing the wafer back into the wafer holder.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   placing a wafer in a wafer holder;
   placing the wafer holder on a loadport of a deposition tool;
   connecting the wafer holder to a front-end interface unit of the deposition tool;
   continuously purging the front-end interface unit with nitrogen, wherein during the purging, an inner space of the wafer holder is joined to an inner space of the front-end interface unit; and
   depositing a metal layer on the wafer in the deposition tool.

2. The method of claim 1, wherein the depositing the metal layer comprises depositing a titanium layer.

3. The method of claim 1, wherein the purging comprises blowing nitrogen directly toward the wafer holder.

4. The method of claim 1, wherein the wafer holder comprises a plurality of wafers, and the plurality of wafers is deposited with metal layers in the deposition tool one-by-one, and during an entirety period of time the plurality of wafers is deposited with metal layers, the front-end interface unit is continuously purged by nitrogen.

5. The method of claim 1, wherein the purging is started before the wafer holder is placed on the loadport.

6. The method of claim 1 further comprising forming a source/drain region in the wafer, wherein the metal layer is in contact with the source/drain region.

7. The method of claim 6 further comprising annealing the wafer, wherein the metal layer and the source/drain region react to form a source/drain silicide region.

8. A method comprising:
forming a source/drain region on a wafer;
performing a cleaning on the wafer using a diluted HF solution;
placing the cleaned wafer into a wafer holder;
transporting the wafer holder onto a loadport of a deposition tool;
connecting a first inner space of the wafer holder to a second inner space of a front-end interface unit of the deposition tool;
continuously purging the front-end interface unit with nitrogen; and
depositing a metal layer on the wafer in the deposition tool.

9. The method of claim 8 further comprising depositing a metal nitride layer on the metal layer and in the deposition tool.

10. The method of claim 8 further comprising transporting the wafer holder away from the loadport, wherein the continuously purging the front-end interface unit is performed throughout an entire period of time the wafer holder is placed on the loadport.

11. The method of claim 8, wherein a plurality of wafers is in the wafer holder, and each of the plurality of wafers is deposited with a metal layer, and during an entire period of time the plurality of wafers is deposited, the front-end interface unit is continuously purged with nitrogen.

12. The method of claim 8, wherein in the purging, a moisture concentration in the front-end interface unit is reduced to lower than about 1,500 parts per million (ppm).

13. The method of claim 8 further comprising purging the wafer holder with nitrogen.

14. A method comprising:
continuously purging a front-end interface unit of a deposition tool with a process gas, wherein the process gas comprises nitrogen and is substantially free from oxygen and moisture;
after the purging is started, placing a wafer holder on a loadport of the deposition tool;
connecting a first inner space in the wafer holder to a second inner space in a front-end interface unit of the deposition tool;
passing a first wafer in the wafer holder into a vacuum body of the deposition tool through the front-end interface unit;
depositing a metal layer on the first wafer; and
placing the first wafer back into the wafer holder.

15. The method of claim 14 further comprising depositing an additional metal layer on a second wafer in the wafer holder, wherein during an entire period of time the first wafer and the second wafer are deposited with the metal layer and the additional metal layer, respectively, the wafer holder is continuously purged with nitrogen.

16. The method of claim 14, wherein in the purging, a moisture concentration in the front-end interface unit is reduced to lower than about 1,500 parts per million (ppm).

17. The method of claim 14 further comprising:
performing a pre-clean on the first wafer; and
placing the first wafer into the wafer holder.

18. The method of claim 14 further comprising, transporting the wafer holder away from the deposition tool, wherein the front-end interface unit is continuously purged after the wafer holder is transported away.

19. The method of claim 14, wherein the process gas comprises substantially pure nitrogen.

20. The method of claim 1 further comprising, transporting the wafer holder away from the deposition tool, wherein the front-end interface unit is further purged after the wafer holder is transported away.

* * * * *